Nov. 29, 1966

E. Q. CARR

COMPONENT CHIP MOUNTED ON SUBSTRATE
WITH HEATER PADS THEREBETWEEN 3,289,046

Filed May 19, 1964

2 Sheets-Sheet 1

Nov. 29, 1966 E. Q. CARR 3,289,046

COMPONENT CHIP MOUNTED ON SUBSTRATE WITH HEATER PADS THEREBETWEEN

Filed May 19, 1964 2 Sheets-Sheet 2

United States Patent Office 3,289,046

Patented Nov. 29, 1966

3,289,046
COMPONENT CHIP MOUNTED ON SUBSTRATE WITH HEATER PADS THEREBETWEEN

Everett Quentin Carr, Frankfort, N.Y., assignor to General Electric Company, a corporation of New York Filed May 19, 1964, Ser. No. 368,610
1 Claim. (Cl. 317—101)

This invention relates to the mounting of semiconductor elements (or equivalent devices) onto substrates having interconnection wiring runs thereon to form complete functional circuits or systems of circuits such as amplifiers or computers. It is particularly useful for interconnecting semiconductor wafers or chips that have a plane surface upon which various specialized regions have been produced by diffusion and/or epitaxial processes whereby a collection of appropriate semiconductor regions provide a semiconductor device such as a transistor or a collection of active and passive semiconductor elements. The invention provides a method for conductively joining the diffusion regions to miniature wiring arrays on a substrate so that the complete circuits or systems of circuits are formed.

In the past, the most common mode of making each electrical connection to a diffusion region of semiconductor wafers has been to bond one end of a very fine conductive wire filament (typically 1 mil in diameter) to the region and the other end of the filament is attached to the appropriate run of a wiring pattern on a substrate. Usually, the filaments are bonded to the semiconductors by a thermo-compression bond. Joining the filaments or "flying" leads to the wafers and wiring runs is a very difficult operation for many reasons including: the fragile nature of the filaments, the extreme small size of the elements, the difficulty of checking bonding results, the limited heat tolerance of the elements, the necessity of making a large number of bonds, the high reliability required for any reasonable practicality, and the difficulties involved in automating operations which vary so much from circuit to circuit. For example, the standard mechanical tests for reliable bonds require the application of mechanical forces at the bonds. While this yields data useful for statistical analysis of bond reliability, it is an undesirable procedure because of its destructive nature.

One aspect of the economic problems of semiconductor microcircuits is the disproportionate cost factors attributable to different circuit elements. Generally, the fabrication of the semiconductor wafer slab and one or more of the numerous processes performed on the semiconductor wafer to produce essential electrical characteristics are quite expensive where specific tolerances or functions are required in the process steps. There also results situations in which the addition of special or unique elements add only incremental costs to the processed wafers. This principle is dependent upon the additional elements requiring only a small fractional portion of the wafer surface. In many instances, obtaining relatively large value capacitors, inductors or resistors, large areas of the semiconductor wafers are required for these and similar passive elements. In addition, there are various other problems such as the natural large temperature dependence and large tolerances on absolute value of even compensated semiconductor resistors. For reasons such as these, it is frequently desirable to form some elements on the supporting insulator substrate with the interconnecting wiring runs. For example, the use of thin film resistors and capacitors formed on a glass or ceramic substrate along with the thin film wiring runs can substantially improve the effective yield of diffused semiconductor wafers and can provide substantial reductions in per circuit costs. However, this approach multiplies the number of connections between the semiconductor wafers and the supporting substrate. This results in additional demands on interconnections which have previously been the major source of volume and cost requirements in microcircuits.

Accordingly, it is an object of the invention to provide a semiconductor chip to wiring substrate assembly which replaces the thermocompression filament connector bonding techniques with an assembly not having separate connector wires.

It is a further object to provide chip to wiring substrate assemblies in which chips can be individually tested and/or replaced.

It is another object of the invention to provide a multiple chip, integral package circuit assembly technique in which the chip surfaces are directly bonded to the wiring substrate by a process subject to direct test.

It is another object of the invention to provide a process of fabricating functional circuits having a substrate with wiring runs by process steps which are readily automated.

Briefly stated, in accordance with certain aspects of the invention, an assembly of a semiconductor chip and a thin film wiring substrate is provided by connecting the chips directly against the wiring substrate. The various semiconductor regions are soldered directly to the thin film runs by the use of heater runs which in part can be provided by the thin film interconnections themselves.

The preferred assembly incorporates split heater runs on the substrate, which split runs are joined through the semiconductor region to which the connection is made. The heater runs are arranged so that the heating current can be localized at the junction to be soldered, brazed or welded and so that a test path directly through the junction is provided.

The features of the invention which are believed to be novel are set forth with particularity in the appended claim. The invention itself, however, both as to its organization and method of operation, together with further objects and advantages thereof, may be best be understood by reference to the following description when taken in connection with the drawings; wherein:

FIGURES 5A–D are plan views of successive deposition layers in a simple semiconductor wafer-thin film substrate assembly.

Figure 6:
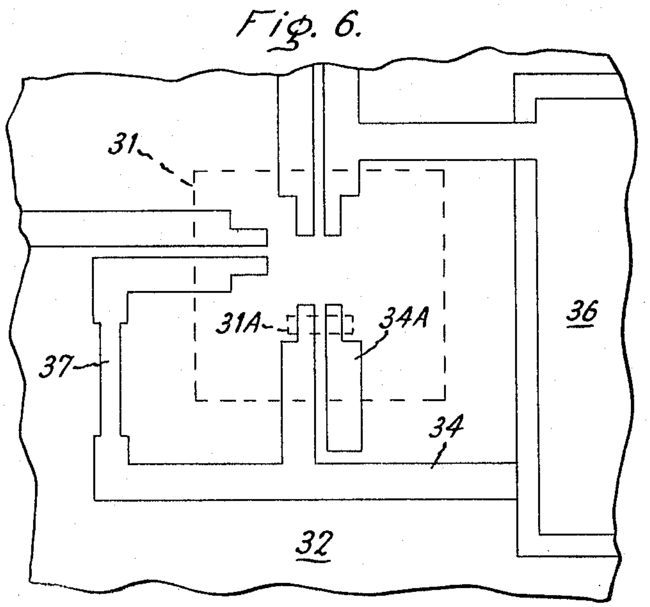

FIGURE 6 is a view of a preferred wafer-substrate assembly.

Figure 1:
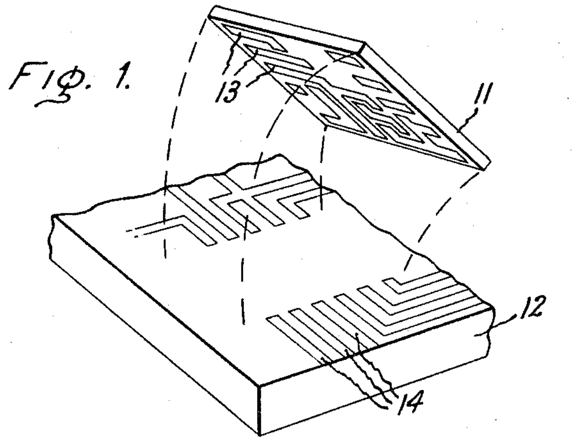
FIGURE 1 is a perspective exploded view of a representative semiconductor wafer and thin film wiring substrate assembled in accordance with the invention.

FIGURE 1 shows, in exploded form, a "Flip-Chip" assembly of a single semiconductor circuit chip or wafer 11 and a wiring substrate 12 upon which thin film runs 14 are deposited for provided circuit interconnections. The chip 11 has various regions 13 on its surface which have been subjected to diffusion processes to produce regions which serve as electrodes, junctions, bases, emitters, collectors, conductors, dielectrics, etc. These regions 13 are placed so as to provide an array of components such as transistors, diodes, other semiconductor elements and interconnections, all on or close to one surface. In order to provide connections for supply voltages, for inter-circuit coupling, for input-output terminals, and usually for intra-circuit coupling, it is necessary to have the wiring matrix provided by the thin film interconnections 14.

Figure 2:
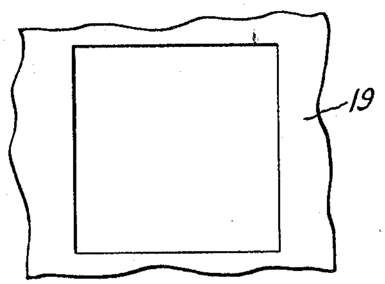
FIGURE 2 is a plan view of an alignment jig for the FIGURE 1 assembly.
Figure 4:
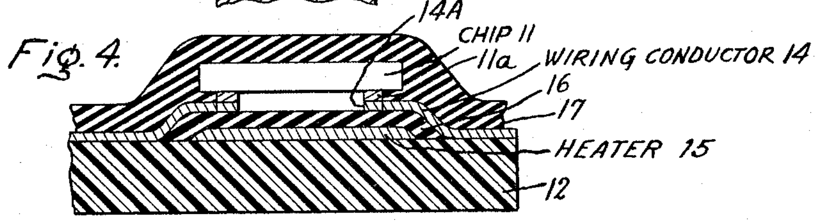

FIGURE 4 shows a simplified but representative cross section of wafer-to-substrate connections soldered in accordance with the present invention. The wiring substrate 12 is prepared for the chip 11 by various previously deposited thin film elements. First heater pads 15 are formed by depositing a resistance film, preferably of a high ohm per square material such as Nichrome. The heater pads 15 are solely for the purpose of supplying heat to the junctions to be bonded and are accordingly arranged to have surface portions accessible to a source of heating current, soldering electrodes 18, 18A. In order to isolate the heater pads 15 from the circuit, an insulator film 16 is deposited over the contact pads 15 through masks which leave portions to be connected to the heating current uncovered. Then the wiring runs are deposited such as by conventional thin film vapor deposition through masks whereby the desired interconnection wiring pattern is produced together with a terminal pattern arrayed to mate with the appropriate diffusion regions 13 of the chip 11. Proper alignment of the chip 11 with the array of the wiring films is conveniently assured by jig 19 of FIGURE 2. Bonding is then produced by pressing chip 11 against the substrate 12 while applying heating current through electrodes 18, 18A to solder interconnection pads 14A of conductive thin film runs 14 to the chip diffusion region terminals 11A. The assembly is conveniently protected by the application of an insulating encapsulating layer 17 consisting of silicon oxide or other deposited glassy overcoat.

Figure 5A:
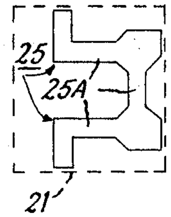
Figure 5B:
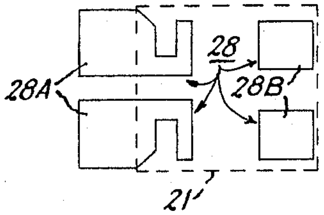
Figure 5C:
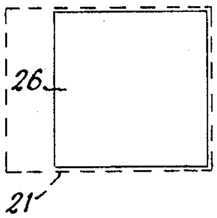
Figure 5D:
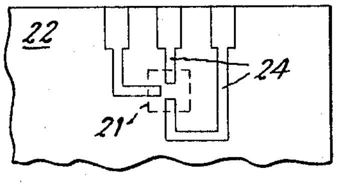

FIGURES 5A–D illustrate a representative configuration of heater pads and interconnection pads adapted to receive a semiconductor wafer which has been processed to produce three co-planar diffusion regions. In FIGURE 5A, a heater 25 is shown as a continuous horse-shoe shaped strip entirely within the bounds of the semiconductor wafer 21. The heater is irregularly shaped with the narrowed portion 25A actually providing individual heater pads which are dimensioned to correspond with the actual surfaces to be bonded. The formation of the heater 25 on the substrate 22 (FIGURE 4D) is the first step in providing interconnections for the semiconductor wafer. A satisfactory heater is provided by conventional vacuum vapor deposition of 80–20 nickel-chromium alloy to a depth of approximately $2 \cdot 10^{-6}$ cm. so as to provide a resistivity of 200Ω per square. The individual heater pads 25A are typically 6 mils by 8 mils and are deposited through a mask. To provide connections to the heater 25 and to short out the portions of heater 25 between the pads 25A so as to localize the heated areas, an aluminum thin film 28 is applied. The aluminum film is applied in the configuration shown in FIGURE 5B by vacuum vapor deposition through a mask. A deposition depth of $3 \cdot 10^{-5}$ cm. is satisfactory. The terminal pads 28A are typically 30 mils square and the interconnection pads 28B, between individual heater pad 25A, are typically 9 x 10 mils. To isolate the heater 25 and heater interconnections 28 from the rest of the circuitry, an insulating thin film 26 of silicon oxide is vapor deposited as shown in FIGURE 5C. Insulating film thickness of $10^{-4}$ cm. is satisfactory and it is typically 30 mils square. The circuit interconnections 24 for the semiconductor wafer 21 are provided by masked vacuum deposition of aluminum on the insulator film 26. These interconnections 24 are formed in essentially the same manner as the aluminum film 28 but are preferably deposited to a depth of $10^{-4}$ cm. so as to minimize circuit interconnection resistance and are terminated in a width corresponding to the semiconductor region to which connection is made, typically 5 mils wide. Conveniently, wafer terminal pads are formed on the semiconductor wafer 21 by an aluminum pad alloyed to the semiconductor diffusion region in the same manner as for pads formed for thermo-compression bonding to flying leads (FIGURE 4). The wafer terminal pads are soldered to the interconnection runs 24 with the use of solder preforms, 70–30 tin-lead alloy discs 2 mils thick by 6 mils in diameter, placed at the soldering points are satisfactory. The soldering is performed preferably with the whole assembly heated to near the solder softening point such as 150° C. to reduce the heating demands on the thin film heater 25. Application of heater current for 30 seconds at 15 ma. causes the solder to melt. Light pressure is applied to the wafers during the soldering which is considered completed by removing the pressure 30 seconds after the heater current is turned off.

FIGURE 6 illustrates a preferred form of the interconnection wiring to enable direct testing of the substrate-to-wafer terminals connections. Interconnection wiring 34 is formed in the usual manner in substantially the same configuration as before, but the portion directly under the wafer terminals is narrowed so as to permit formation of an auxiliary testing pad 34A. This testing pad 34A is electrically isolated from the circuit interconnection wiring when formed, but it is electrically connected through the semiconductor wafer terminal pad to wiring 34 when the wafer is bonded to the substrate. If the bond is defective, leaving an open circuit between the wiring 34 and the semiconductor wafer, this defect will be revealed by a resistance or R–F check between test pad 34A and wiring 34.

FIGURE 6 also illustrates a capacitor 36 and resistor 37, formed by conventional thin film techniques, which are deposited on the substrate 32. The formation of large value capacitances on the substrate 32 relieves the area demands on the semiconductor wafer 31 and the formation of critical resistors on substrate 32 permits much tighter resistor tolerances without making semiconductor wafer requirements difficult.

Figure 3:
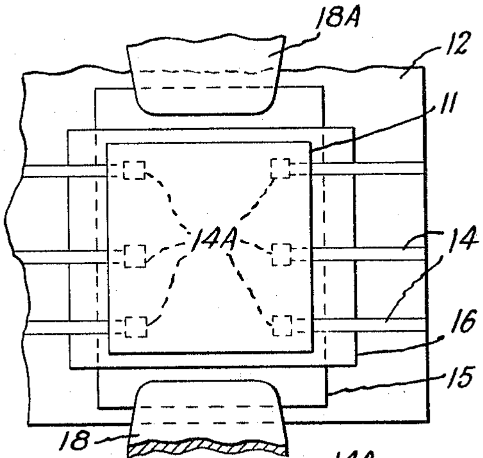
FIGURES 3 and 4 are plan and elevation section views of a simplified assembly of the FIGURE 1 type illustrating details thereof.

Desirably, the conductive runs 34 and auxiliary testing pads 34A are adapted to serve as portions of the heating circuit so that separate heating elements such as elements 15 and 16 in FIGURE 3 can be eliminated. The configuration of runs 34 and pads 34A as shown in FIGURE 6 have reduced widths which localize the heat generated by a current passed therethrough whereby the terminal pads 31A on chips 31 are bonded to the thin film wiring runs 34 on substrate 32.

In the description above, references have been made to semiconductor "wafers" and "chips." While the use of these terms varies somewhat in the art, the tendency is to refer to the semiconductor component in final condition for installation on a header or the equivalent as a "chip." It is also called a "die" or "pellet," etc. The "wafer" is generally the semiconductor body as processed up to the point of being broken up into chips. The chips may have a single diode, transistor, etc., or a number of these. It may also include different kinds of components. The components may or may not be interconnected to form a simple circuit such as an emitter-follower or gate. The chip may also include a number of simple circuits with interconnections. A wafer is typically one inch in diameter and ten mils thick. It is basically the sum of what is required for the number of chips into which it is broken. It is to be understood that the invention is applicable to equivalent elements such as polycrystalline thin film semiconductor elements which include active devices, etc., requiring interconnection wiring.

While glass and ceramics provide suitable materials for forming substrates having an insulator plane surface and good mechanical rigidity, other materials such as those suitable for etched wiring boards are satisfactory and even metal plates with an insulator layer can be used. The interconnecting wiring runs need not be thin films but can also be produced by conventional precision etching techniques or by precision deposition through screens.

The essential features of the invention include the use of a number of inverted microcircuit devices having terminals in one plane which register with and are directly bonded to corresponding terminals in a wiring array on a rigid substrate. While the bond is described as a solder bond, the distinctions between soldering, brazing and welding are somewhat indefinite. The specific bonding process selected is determined by a number of factors. In particular, the choice of materials for the device terminals and the wiring runs limits the possible bonding processes. However, such processes can even include the use of conductive adhesives. In any event the inverted device configuration, as compared with the use of "flying" leads, halves the number of bonds required, reduces the bond geometry to a single plane, and permits the mechanization of bonding operations in accordance with a grid pattern.

While particular embodiments of the invention have been shown and described, it is not intended that the invention be limited to such disclosure, but that changes and modifications obvious to those skilled in the art can be made and incorporated within the scope of the claim.

What is claimed is:

An assembly of a multiple component chip device mounted on a substrate having interconnecting wiring runs comprising:

(a) a multiple component chip device adapted for inverted mounting by having its terminal regions arranged in a single plane;

(b) a substrate;

(c) heater pads formed on said substrate in a pattern registering with said chip terminal regions;

(d) wiring runs formed on said substrate, the runs having terminal portions geometrically spaced to register and mate with corresponding terminal portions on said chip;

(e) electrical and mechanical bonds formed between said terminal region and said terminal portion on said inverted chip and said substrate runs, respectively.

References Cited by the Examiner

UNITED STATES PATENTS

| | | | |
|---|---|---|---|
| 3,114,867 | 12/1963 | Szekely. | |
| 3,158,788 | 11/1964 | Last | 317—101 |
| 3,158,927 | 12/1964 | Saunders | 29—155.5 |
| 3,178,804 | 4/1965 | Ullery et al. | 29—155.5 |
| 3,197,608 | 7/1965 | Ingraham | 219—85 |
| 3,206,647 | 9/1965 | Kahn | 317—101 |

ROBERT K. SCHAEFER, *Primary Examiner.*

KATHLEEN H. CLAFFY, *Examiner.*

W. C. GARVERT, *Assistant Examiner.*